United States Patent [19]
Hisamune

[11] Patent Number: 5,946,240
[45] Date of Patent: Aug. 31, 1999

[54] NONVOLATILE SEMICONDUCTOR MEMORY DEVICE AND METHOD OF MANUFACTURING THE SAME

[75] Inventor: Yosiaki Hisamune, Tokyo, Japan

[73] Assignee: NEC Corporation, Tokyo, Japan

[21] Appl. No.: 08/997,238

[22] Filed: Dec. 23, 1997

[30] Foreign Application Priority Data

Dec. 25, 1996 [JP] Japan .................................. 8-345090

[51] Int. Cl.[6] .................................................. G11C 16/00
[52] U.S. Cl. ............................ 365/185.28; 365/185.05; 257/316; 257/317
[58] Field of Search ...................... 365/185.28, 185.05, 365/185; 257/316, 319, 314, 317, 318

[56] References Cited

U.S. PATENT DOCUMENTS

| | | | |
|---|---|---|---|
| 5,394,360 | 2/1995 | Fukumoto | 257/318 |
| 5,402,374 | 3/1995 | Tsuruta et al. | 257/319 |
| 5,445,983 | 8/1995 | Hong | 437/43 |
| 5,455,792 | 10/1995 | Yi | 257/316 |
| 5,467,308 | 11/1995 | Chang et al. | 257/316 |
| 5,477,068 | 12/1995 | Ozawa | 257/319 |
| 5,614,747 | 3/1997 | Ahn et al. | 257/316 |
| 5,656,840 | 8/1997 | Yang | 257/319 |
| 5,691,939 | 11/1997 | Chang et al. | 257/316 |
| 5,710,735 | 1/1998 | Shin et al. | 257/319 |
| 5,753,953 | 5/1998 | Fukumoto | 257/316 |

FOREIGN PATENT DOCUMENTS

| | | |
|---|---|---|
| 59-121980 | 7/1984 | Japan . |
| 2-309681 | 12/1990 | Japan . |
| 7-130884 | 5/1995 | Japan . |

OTHER PUBLICATIONS

Y. Ma et al., "A Novel High Density Contactless Flash Memory Array Using Split–Gate Source–Side–. . . Applications", *1994 Symposium on VLSI Technology Digest of Technical Papers*, 1994, pp. 49–50.

Yale Ma et al., "A Dual–bit Split–Gate EEPROM (DSG) Cell in Contactless Array for Single–Vcc High Density Flash Memories", *IEDM 94*, 1994, pp. 57–60.

*Primary Examiner*—Tan T. Nguyen
*Attorney, Agent, or Firm*—Sughrue, Mion, Zinn, Macpeak & Seas, PLLC

[57] ABSTRACT

In a nonvolatile semiconductor memory device, buried diffusion layers are stripped parallel to each other in a surface region of a semiconductor substrate of a first conductivity type, and constitute bit lines. A select-gate electrode is formed on the semiconductor substrate, between source and drain regions, through a first gate insulating film to be parallel to the source and drain regions. At least one side of the select-gate electrode is offset from the source and drain regions. A floating-gate electrode is in contact with upper and side surfaces of the select-gate electrode through second and third gate insulating films, respectively, and with the semiconductor substrate through a fourth gate insulating film. The two sides of the floating-gate electrode at least partly overlap the source and drain regions. A control-gate electrode is formed on the floating-gate electrode to surround the floating-gate electrode through a fifth gate insulating film. The control-gate electrode perpendicularly intersects the source and drain regions to constitute a word line. A method of manufacturing a nonvolatile semiconductor memory device is also disclosed.

7 Claims, 8 Drawing Sheets

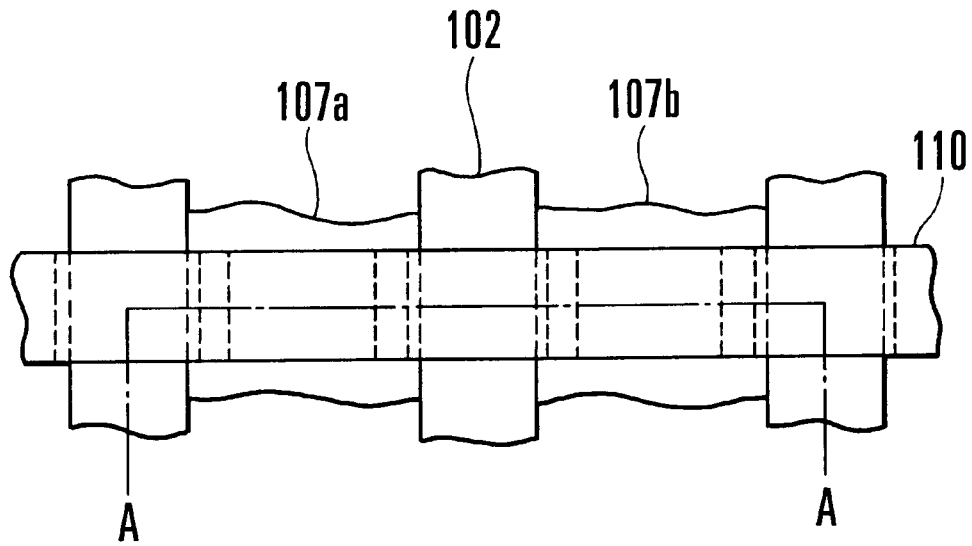
F I G. 1A
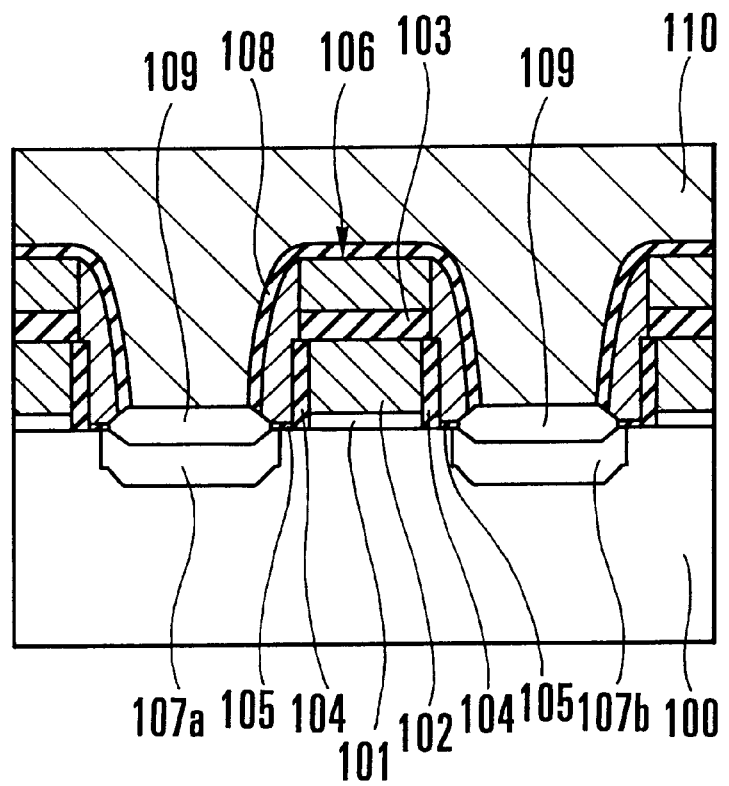
F I G. 1B

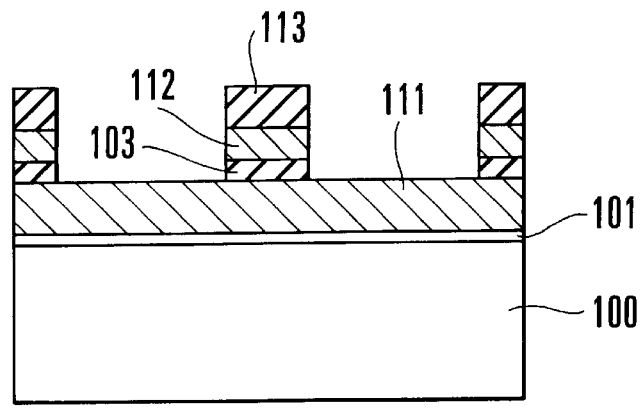
F I G. 2 A
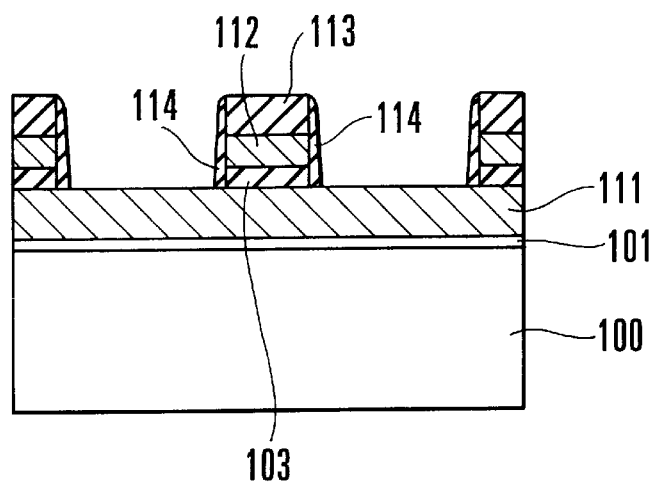
F I G. 2 B
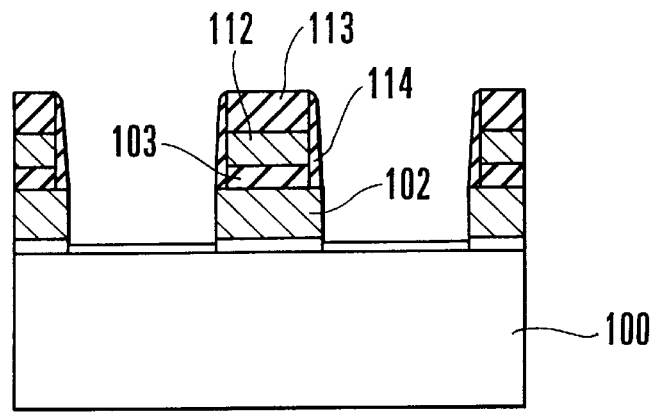
F I G. 2 C

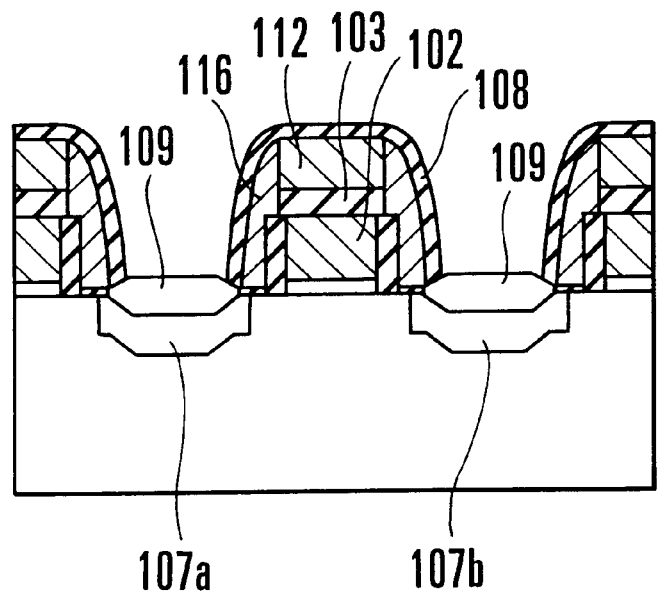
F I G. 2 F
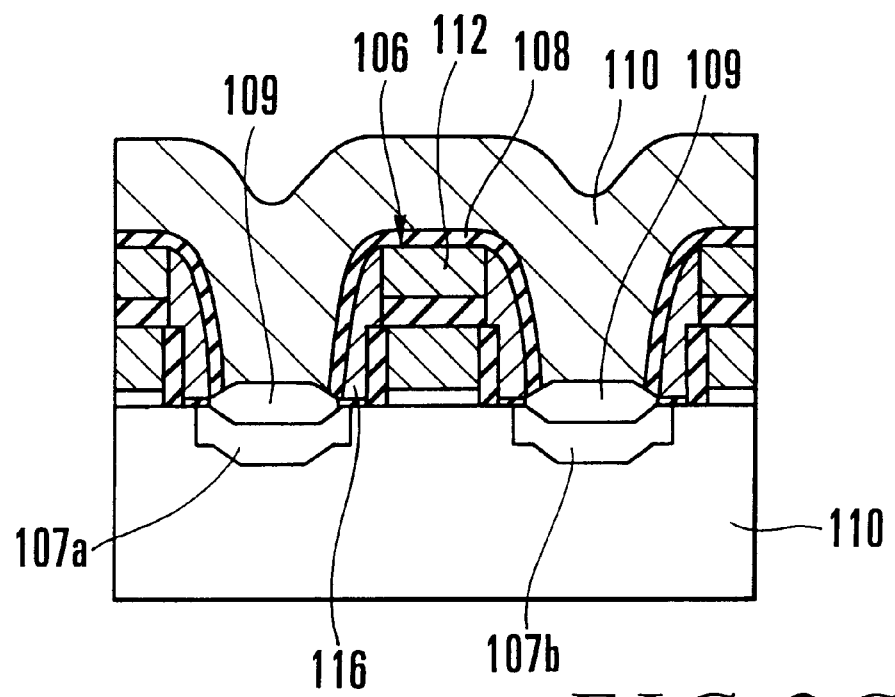
F I G. 2 G

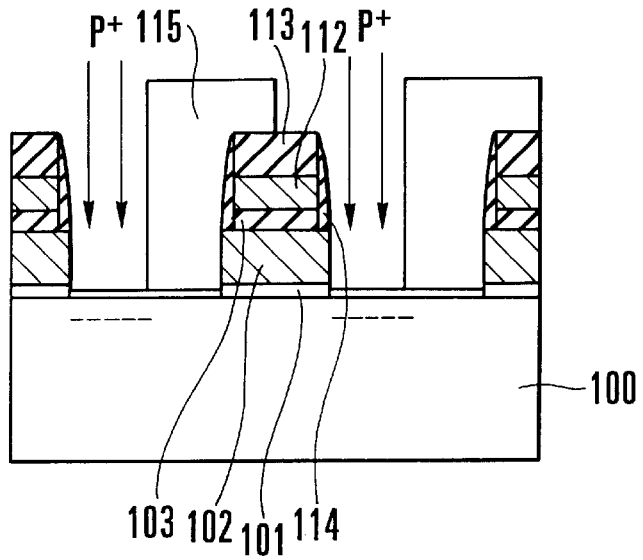
F I G. 4A
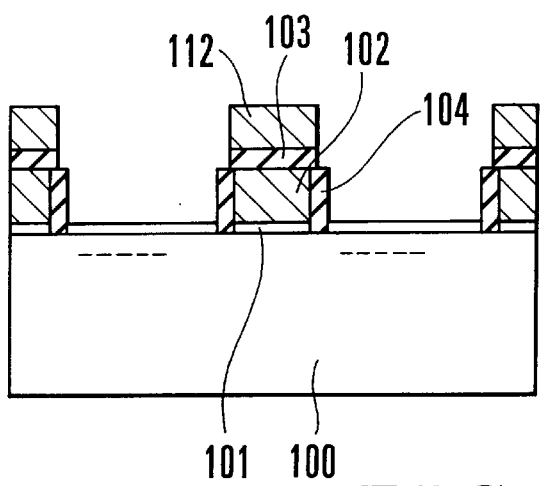
F I G. 4B
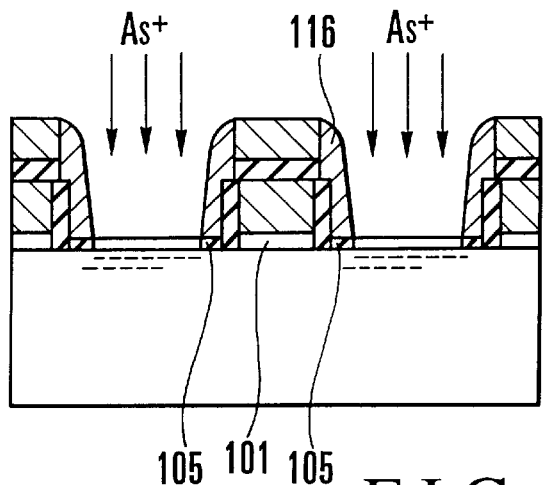
F I G. 4C

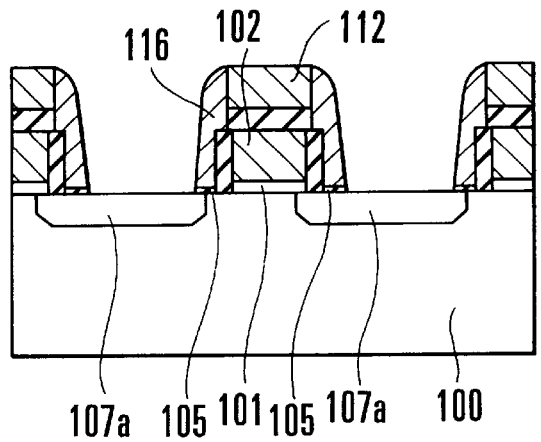
F I G. 4 D
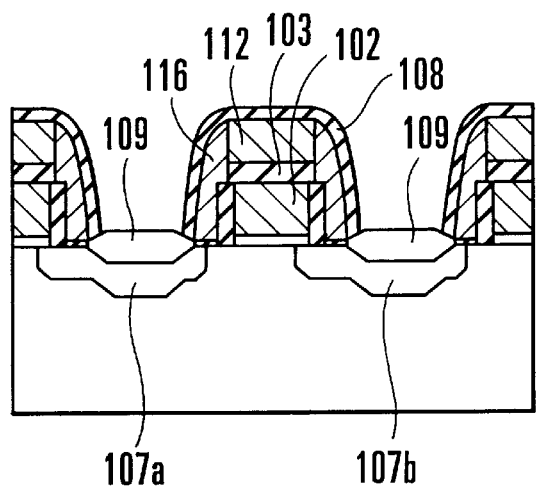
F I G. 4 E
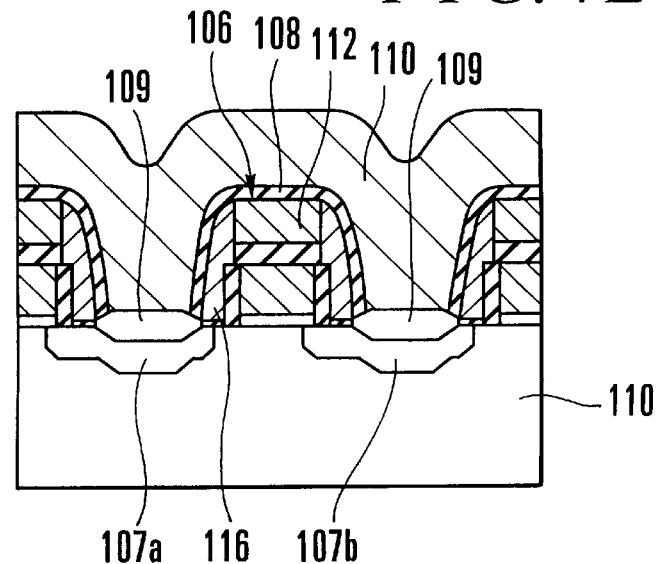
F I G. 4 F

NONVOLATILE SEMICONDUCTOR MEMORY DEVICE AND METHOD OF MANUFACTURING THE SAME

BACKGROUND OF THE INVENTION

The present invention relates to a nonvolatile semiconductor memory device and a method of manufacturing the same and, more particularly, to a nonvolatile semiconductor memory device a memory cell of which has a floating-gate electrode, a select-gate electrode, and a control-gate electrode, and a method of manufacturing the same.

In recent years, the integration degree of a nonvolatile semiconductor memory device, e.g., an EEPROM (Electrically Erasable and Programmable Read Only Memory), an EPROM (Erasable and Programmable Read Only Memory), and a flash EEPROM and has been increasing, and the memory cell has been micropatterned. As a memory cell occupying a small area, a "contactless array" in which the buried diffusion layers serve as bit lines and the respective cells do not form contacts with the bit lines has been realized.

Usually, the memory cell of a semiconductor memory device of this type has a multilayered gate structure consisting of source and drain regions formed on the surface of a substrate, a channel region provided between the source and drain regions, a floating-gate electrode formed on the channel region through the first gate insulating film, and a control-gate electrode formed on the floating-gate electrode through the second gate insulating film. In recent years, a memory cell in which a select-gate electrode is added to the multilayered gate structure has been proposed in order to increase the degree of freedom of operations, e.g., write, erase, and read, of the memory cell.

FIG. 5 shows the sectional portion of a nonvolatile semiconductor memory device, proposed by Japanese Patent Laid-Open No. 7-130884, to which a select-gate electrode is added. Referring to FIG. 5, reference numeral 201 denotes a p-type silicon substrate, 202, an n-type diffusion layer (drain); 203, an n-type diffusion layer (source); 204, a first gate oxide film; 205, a floating-gate electrode; 206, a second gate oxide film; 207, a select (transfer)-gate electrode; 208, a third gate oxide film; 209, a control-gate electrode; and 210, a protective film. In this memory cell, the floating-gate electrode 205 is formed as the side wall of the select-gate electrode 207, so that the area occupied by the floating-gate electrode 205 with respect to the memory cell can be decreased greatly.

The operation of the nonvolatile semiconductor memory device shown in FIG. 5 will be described. To perform a write operation, the p-type silicon substrate 201 is grounded, and 0 V, 1.5 V, 17 V, and 5 V are applied to the source 203, the select-gate electrode 207, the control-gate electrode 209, and the drain 202, respectively. Hot electrons are then generated below a portion near the interface between the select-gate electrode 207 and floating-gate electrode 205, and are injected to the floating-gate electrode 205, thereby performing the data write operation.

To erase data, the drain 202 and the control-gate electrode 209 are set to 14 V and 0 V, respectively, and the select-gate electrode 207 is opened. Then, electrons are emitted from the floating-gate electrode 205 to the drain 202 by the Fowler-Nordheim (to be abbreviated as FN hereinafter) tunnel current, thereby performing the erase operation.

To read data stored in the memory cell, 5 V, 1 V, 0 V, and 5 V are applied to the control-gate electrode (word line) 209, the drain (bit line) 202, the source 203, and the select-gate electrode 207, respectively, to select a specific memory cell. At this time, the current flowing between the source and drain changes depending on whether electrons are accumulated in the floating-gate electrode 205, so that data "0" or "1" can be determined.

In the conventional nonvolatile semiconductor memory device described above, since the floating-gate electrode is formed as the side wall of the select-gate electrode, the contact area through which the floating-gate electrode and control-gate electrode contact each other is small, and the coupling capacitance between the floating-gate electrode and control-gate electrode is small. For this reason, even when a high potential is applied to the control-gate electrode, the potential of the floating-gate electrode does not increase sufficiently. In the write and erase operations, electrons cannot be efficiently injected or emitted.

In the conventional case described above, when forming the floating-gate electrode, a polysilicon film must be etched back by anisotropic dry etching to form a polysilicon side wall to cover the two side surfaces of the select-gate electrode. Thereafter, the source-side polysilicon side wall must be masked with a resist and the source-side polysilicon side wall must be removed by etching. This prolongs the manufacturing process (mask step) and increases the manufacturing cost.

SUMMARY OF THE INVENTION

It is an object of the present invention to provide a multilayered gate type nonvolatile semiconductor memory device in which the coupling capacitance between the floating-gate electrode and control-gate electrode can be increased, and a method of manufacturing the same.

It is another object of the present invention to provide a multilayered gate type nonvolatile semiconductor memory device that can be manufactured with a smaller number of mask steps, and a method of manufacturing the same.

In order to achieve the above objects, according to the present invention, there is provided a nonvolatile semiconductor memory device comprising source and drain regions of a second conductivity type stripped parallel to each other in a surface region of a semiconductor substrate of a first conductivity type and constituting bit lines, a select-gate electrode formed on the semiconductor substrate, between the source and drain regions, through a first gate insulating film to be parallel to the source and drain regions, at least one side of the select-gate electrode being offset from the source and drain regions, a floating-gate electrode which is in contact with upper and side surfaces of the select-gate electrode through second and third gate insulating films, respectively, and with the semiconductor substrate through a fourth gate insulating film, two sides of the floating-gate electrode at least partly overlapping the source and drain regions, and a control-gate electrode formed on the floating-gate electrode to surround the floating-gate electrode through a fifth gate insulating film, the control-gate electrode perpendicularly intersecting the source and drain regions to constitute a word line.

BRIEF DESCRIPTION OF THE DRAWINGS

FIG. 1A is a plan view of a semiconductor memory device according to the first embodiment of the present invention, and FIG. 1B is a sectional view taken along the line A—A of FIG. 1A;

FIGS. 2A to 2G are sectional views, taken along the line A—A of FIG. 1A, to show the steps in manufacturing the semiconductor memory device shown in FIGS. 1A and 1B;

FIGS. 4A to 4F are sectional views, taken along the line A—A of FIG. 3A, to show the steps in manufacturing the semiconductor memory device shown in FIGS. 3A and 3B.

DESCRIPTION OF THE PREFERRED EMBODIMENTS

Figure 2D:
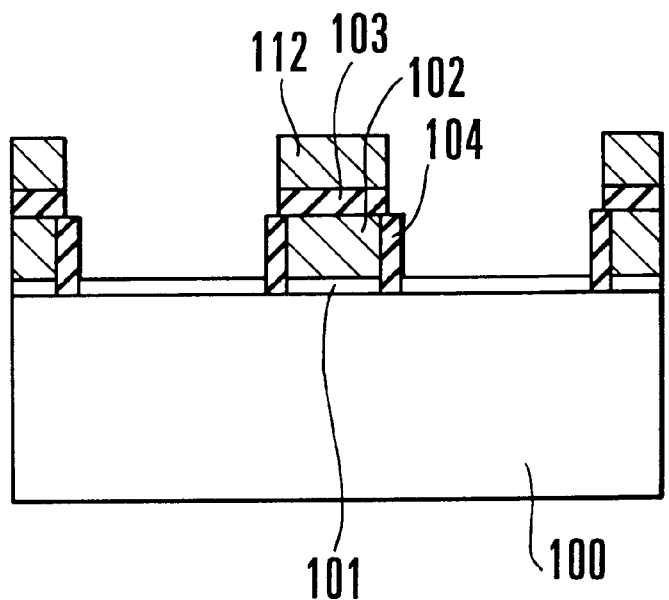

The present invention will be described in detail with reference to the accompanying drawings.

[First Embodiment]

FIG. 1A shows a floating-gate type nonvolatile semiconductor memory device according to the first embodiment of the present invention, and FIG. 1B shows a section taken along the line A—A of FIG. 1A. This embodiment concerns a memory having a virtual ground array (VGA) arrangement in which the buried diffusion layers serve as bit lines, and its characteristic feature resides in that it has a select-gate electrode parallel to the bit lines.

Referring to FIG. 1B, a plurality of select-gate electrodes 102 are formed on the major surface of a p-type silicon substrate 100 each through a first gate insulating film 101 having a thickness of about 15 nm. The select-gate electrodes 102 are stripped (like belts) parallel to each other, as shown in FIG. 1A. A second gate insulating film 103 having a thickness of about 25 nm is formed on the upper surface of the select-gate electrode 102, and third gate insulating films 104 each having a thickness of about 25 nm are formed on the side surfaces of the select-gate electrode 102. Fourth gate insulating films 105 each having a thickness of about 8 nm are formed on the surface of the silicon substrate 100 on the two sides of the select-gate electrode 102.

A floating-gate electrode 106 is formed to cover the select-gate electrode 102 through the second and third gate insulating films 103 and 104. The floating-gate electrode 106 is partly in contact with the silicon substrate 100 through the fourth gate insulating films 105. N-type buried diffusion layers 107a and 107b serving as source and drain regions, respectively, are formed within the surface area of the silicon substrate 100 sandwiched by the select-gate electrodes 102 to be parallel to the select-gate electrodes 102. The buried diffusion layers 107a and 107b serve as bit lines as well, and comparatively thick silicon oxide films 109 having a thickness of about 80 nm are formed on their surfaces, respectively.

A control-gate electrode 110 is formed on the surface of the floating-gate electrode 106 through a fifth gate insulating film 108 having a thickness of about 20 nm to perpendicularly intersect the bit lines (buried diffusion layers 107a and 107b), as shown in FIG. 1A, and serves as a word line. The buried diffusion layers 107a and 107b serving as the source and drain, respectively, are formed to partly overlap the floating-gate electrodes 106. In this case, the two ends of the floating-gate electrode do not overlap the buried diffusion layers 107a and 107b.

The operation of the memory cell having the above arrangement will be described. Information in the memory cell is determined by the charge amount in the floating-gate electrode 106. Note that a state wherein no electrons are present in the floating-gate electrode 106 and the memory cell transistor has a low threshold voltage is defined as write state "1", and that a state wherein electrons are present in the floating-gate electrode 106 and the memory cell transistor has a high threshold voltage is defined as erase state "0".

Information is read from a memory cell (m,n) by setting a selected word line Wm and a selected select-gate electrode Sn to a high potential (e.g., 3 V) (applying a high potential to them), setting nonselected word lines Wk (k≠m) and nonselected select-gate electrodes Sj (j≠n) to 0 V, setting selected bit lines Bn−1 and Bn serving as a source and a drain to 0 V and a high potential (e.g., 1 V), respectively, and opening all the nonselected bit lines Bj (j≠n−1, n).

Information is written in the memory cell (m,n) by electron emission of the F-N tunnel current from the floating-gate electrode 106 to the drain 107b. More specifically, this is performed by setting the selected word line Wm to a negative high potential (e.g., −8 V), setting all the select-gate electrodes Sj and nonselected word lines Wk (k≠m) to 0 V, setting the selected bit lines Bn−1 and Bn serving as the source and drain to 0 V and a high potential (e.g., 3 V), respectively, and opening all the nonselected bit lines Bj (j≠n−1, n). At this time, a voltage enough to flow the F-N tunnel current is applied to the fourth gate insulating films 105 of the memory cell (m,n), and electrons are emitted from the floating-gate electrode 106 to the drain.

Stored information is erased by electron injection of the F-N tunnel current from the buried diffusion layers 107a and 107b, serving as the source and drain, respectively, to the floating-gate electrode 106. More specifically, information in the memory cell is erased in units of word lines at once by setting all the bit lines Bj to 0 V, setting the selected word line Wm to a positive high voltage (e.g., +12 V), and setting all the nonselected word lines Wk (k≠m) and select-gate electrodes Sj to 0 V.

In the operation of the memory cell described above, write and erase operations of the memory cell are performed by the F-N tunnel current, and channel-hot electron injection requiring a large write current is not employed. Therefore, the size of an internal step-up circuit that must be mounted in a nonvolatile semiconductor memory device can be decreased.

Table 1 shows typical voltages to be applied for the respective operations of a memory cell having a gate length of about 0.4 µm to 0.8 µm.

TABLE 1

|  | Word Line | | Select-Gate Electrode | |
| --- | --- | --- | --- | --- |
|  | Selected | Non-selected | Selected | Non-selected |
| Read | +3 V | 0 V | +3 V | 0 V |
| Write | −8 V | 0 V | 0 V | 0 V |
| Erase | 12 V | 0 V | 0 V | 0 V |

|  | Bit Line | | |
| --- | --- | --- | --- |
|  | Selected | | |
|  | Drain | Source | Nonselected |
| Read | +1 V | 0 V | open |
| Write | +3 V | 0 V | open |
| Erase | 0 V | 0 V | 0 V |

[Manufacturing Method of First Embodiment]

A method of manufacturing the semiconductor memory device shown in FIGS. 1A and 1B will be described with reference to the process views shown in FIGS. 2A to 2H. FIGS. 2A to 2H show a section taken along the line A—A of FIG. 1A.

As shown in FIG. 2A, the first gate insulating film 101 made of a 20-nm thick silicon oxide film is formed on the major surface of the p-type silicon substrate 100 by thermal oxidation. Subsequently, a 150-nm thick phosphorus-doped first polysilicon film 111, the second gate insulating film 103 made of a 25-nm thick silicon oxide film, a 150-nm thick phosphorus-doped second polysilicon film 112, and a 150-nm thick silicon nitride film 113 are sequentially formed by chemical vapor deposition (CVD).

The silicon nitride film 113, the second polysilicon film 112, and the second gate insulating film 103 are patterned into select-gate patterns parallel to each other by photolithography and dry etching.

As shown in FIG. 2B, a 150-nm thick silicon nitride film is formed on the resultant structure by CVD and is etched back by anisotropic dry etching to form silicon nitride side walls 114.

As shown in FIG. 2C, using the silicon nitride film 113 and silicon nitride side walls 114 as the mask, the first polysilicon film 111 is patterned by anisotropic dry etching to form the select-gate electrode 102.

As shown in FIG. 2D, the third gate insulating films 104 each made of a 50-nm thick silicon oxide film are formed on the side walls of the select-gate electrode 102 by thermal oxidation. Subsequently, the silicon nitride film 113 and silicon nitride side walls 114 are removed.

Figure 2E:
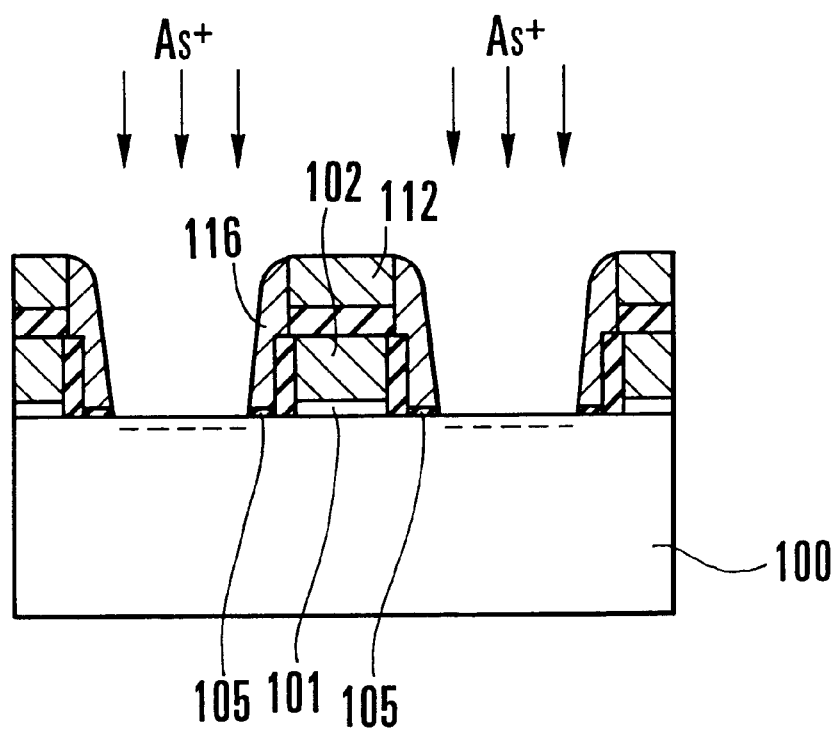

As shown in FIG. 2E, the fourth gate insulating films 105 each made of a silicon oxide film or silicon nitride and oxide films having a thickness of about 10 nm are formed on the surface of the silicon substrate 100 on the two sides of the select-gate electrode 102. A 100-nm thick phosphorus-doped polysilicon film is formed on the resultant structure by CVD and is etched back by anisotropic dry etching to form polysilicon side walls 116. The formed polysilicon side walls 116 are connected to the side surfaces of the second polysilicon film 112. Using the resultant structure, arsenic (As) is ion-implanted to the silicon substrate 100 at a dose of $5 \times 10^{15}$ cm$^{-2}$.

As shown in FIG. 2F, the fifth gate insulating film 108 made of a silicon oxide film or consisting of a silicon oxide film, a silicon nitride film, and a silicon oxide film (Oxide-nitride-oxide: ONO), and having a thickness of about 20 nm when converted into the thickness of a silicon oxide film, is formed on the surfaces of the second polysilicon film 112 and polysilicon side walls 116. To form the fifth gate insulating film 108, arsenic implanted in the silicon substrate 100 is activated to form the buried diffusion layers 107a and 107b constituting the bit lines and thermal oxidation is performed. In this thermal oxidation, silicon is oxidized at a high rate on the buried diffusion layers 107a and 107b to form the thick silicon oxide films 109. For example, assuming that the 23-nm thick silicon oxide film formed by thermal oxidation of polysilicon is the fifth gate insulating film 108, the silicon oxide films 109 are formed to have a thickness of about 50 nm.

As shown in FIG. 2G, a 300-nm thick phosphorus-doped polysilicon film is formed on the resultant structure and is patterned by photolithography and anisotropic dry etching to form the control-gate electrode 110 serving as the word line. Subsequently, the fifth gate insulating film 108 is selectively removed, and the second polysilicon film 112 and polysilicon side walls 116 are patterned to be self-aligned with the control-gate electrode 110, thereby forming the floating-gate electrode 106.

Finally, an insulating interlayer film is formed in accordance with an ordinary semiconductor integrated circuit forming method. Contact holes are formed and are filled with a conductive material. Thereafter, metal interconnections and electrodes are formed, thereby completing the manufacturing steps of the nonvolatile semiconductor memory device of this embodiment basically. If contact holes are formed in units of several- to several 10-bit memory cells constituted by the buried diffusion layers 107a and 107b, after the contact holes are filled with the conductive material, metal interconnections may be formed parallel to the bit lines, so that the resistance of the bit lines can be decreased.

[Second Embodiment]

Figure 3A:
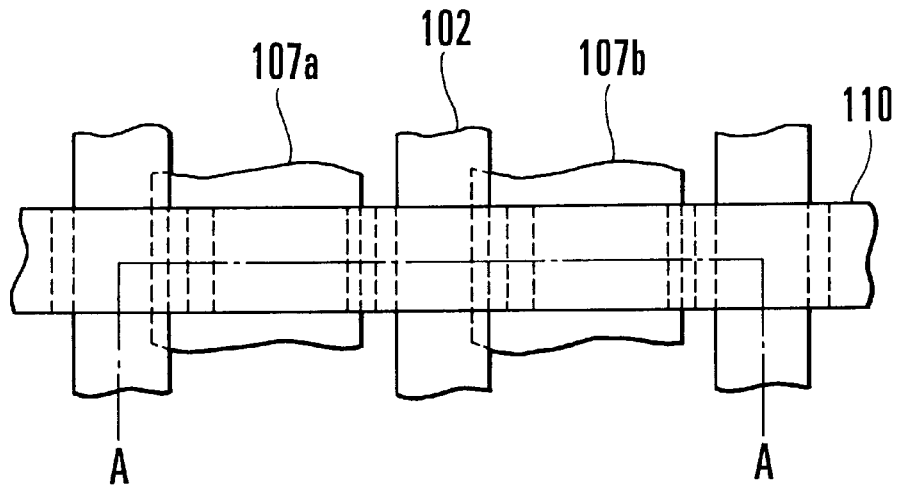
FIG. 3A is a plan view of a semiconductor memory device according to the second embodiment of the present invention.
Figure 3B:
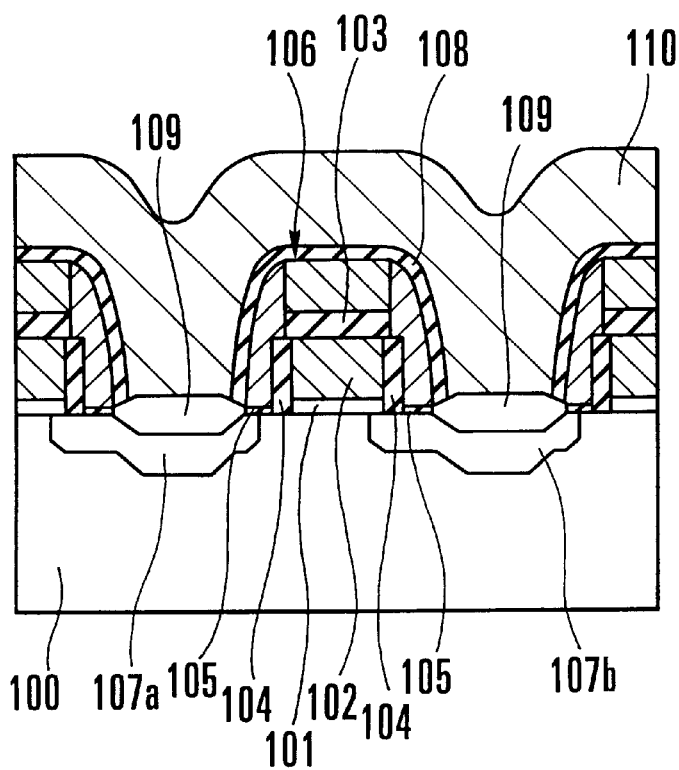
FIG. 3B is a sectional view taken along the line A—A of FIG. 3A.
Figure 5:
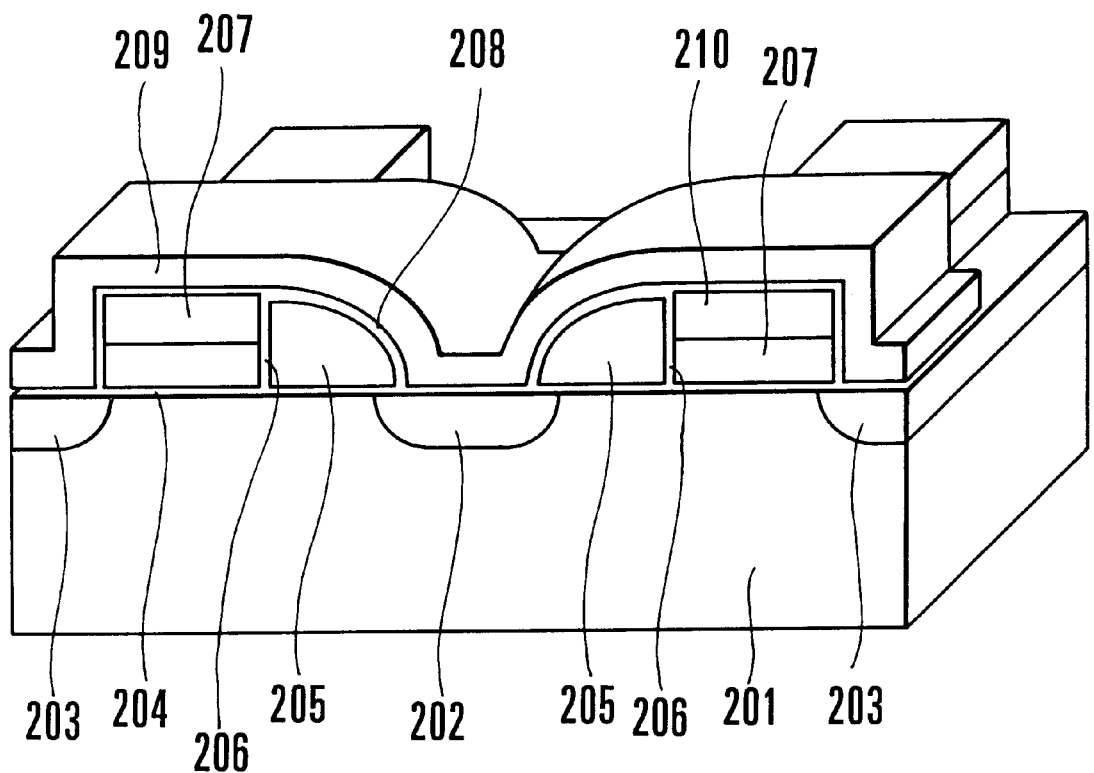
FIG. 5 is a perspective view showing the sectional structure of a conventional semiconductor memory device.

FIG. 3A shows a floating-gate type nonvolatile semiconductor memory device according to the second embodiment of the present invention, and FIG. 3B shows a section taken along the line A—A of FIG. 3A. In FIGS. 3A and 3B, portions that are identical to those of the first embodiment shown in FIGS. 1A and 1B are denoted by the same reference numerals as in FIGS. 1A and 1B, and a detailed description thereof will be omitted. The second embodiment also concerns a memory having a VGA arrangement in which the buried diffusion layers serve as bit lines, and its characteristic feature resides in that it has a select-gate electrode parallel to the bit lines.

In the second embodiment, as shown in FIGS. 3A and 3B, a buried diffusion layer 107a serving as a source is formed to offset from a select-gate electrode 102, and a buried diffusion layer 107b serving as a drain is formed to partly overlap the select-gate electrode 102.

The operation of the memory cell according to the second embodiment will be described. Information in the memory cell is determined by the charge amount in the floating-gate electrode. Note that a state wherein no electrons are present in the floating-gate electrode and the memory cell transistor has a low threshold voltage is defined as erase state "0", and that a state wherein electrons are present in the floating-gate electrode and the memory cell transistor has a high threshold voltage is defined as write state "1".

Information is read from a memory cell (m,n) by setting a selected word line Wm and a selected select-gate electrode Sn to a high potential (e.g., 3 V), setting nonselected word lines Wk (k≠m) and nonselected select-gate electrodes Sj (j≠n) to 0 V, setting selected bit lines Bn−1 and Bn serving as a source and a drain to 0 V and a high potential (e.g., 1 V), respectively, and opening all the nonselected bit lines Bj (j≠n−1, n).

If electrons are injected to a floating-gate electrode 106, no current flows to the selected bit line Bn. This state can be determined as "1". If no electrons are injected to the floating-gate electrode 106, a current flows to the selected bit line Bn. This state can be determined as "0".

Information is written in the memory cell (m,n) by channel-hot electron injection. More specifically, this is performed by setting the selected word line Wm to a high potential (e.g., 10 V), setting the nonselected word lines Wk (k≠m) to 0 V, setting the selected bit lines Bn−1 and Bn serving as the source and drain to 0 V and a high potential (e.g., 1 V), respectively, and opening all the nonselected bit lines Bj (j≠n−1, n).

At this time, when a low positive voltage (e.g., 1 V) is applied to the selected select-gate electrode Sn and 0 V is applied to the nonselected gate electrodes Sj (j≠n), electric field concentration occurs at the end of the source 107a on the floating-gate electrode 106 side, and hot electrons are generated and injected to the floating-gate electrode 106, thereby writing information.

This write scheme is performed by causing electric field concentration in the direction of channel in a region where the select-gate electrode 102 does not overlap the buried diffusion layer 107a and the channel resistance becomes comparatively high, and injecting the hot electrons generated by this electric field concentration to the floating-gate electrode 106. When the hot electrons generated in the source 107a side are injected (source-side injection: SSI) in this manner, the rate of occurrence/injection is high, and a memory cell having high write performance can be provided.

Stored information is erased by electron emission of the F-N tunnel current from the floating-gate electrode 106 to the drain 107a. More specifically, information in the memory cell is erased in units of bit lines at once by setting the selected bit line Bn serving as the drain to a positive high voltage (e.g., +12 V) and setting all the remaining bit lines, the word line Wk, and the selected gate electrode to 0 V.

Table 2 shows typical voltages to be applied for the respective operations of a memory cell having a gate length of about 0.4 $\mu$m to 0.8 $\mu$m.

TABLE 1

|  | Word Line | | Select-Gate Electrode | |
|---|---|---|---|---|
|  | Selected | Non-selected | Selected | Non-selected |
| Read | +3 V | 0 V | +3 V | 0 V |
| Write | +10 V | 0 V | +1 V | 0 V |
| Erase | 0 V | 0 V | 0 V | 0 V |

|  | Bit Line | | |
|---|---|---|---|
|  | Selected | | |
|  | Drain | Source | Nonselected |
| Read | +1 V | 0 V | open |
| Write | +3 V | 0 V | open |
| Erase | +12 V | 0 V | 0 V |

[Manufacturing Method of Second Embodiment]

A method of manufacturing the semiconductor memory device shown in FIGS. 3A and 3B will be described with reference to the process views shown in FIGS. 4A to 4F. FIGS. 4A to 4F show a section taken along the line A—A of FIG. 3A.

In the manufacturing steps of the second embodiment as well, the manufacturing steps of the first embodiment shown in FIGS. 2A to 2C are performed unchanged, and a repetitive explanation will thus be omitted. The semiconductor device is formed into the state shown in FIG. 2C. Thereafter, as shown in FIG. 4A, half of each region between the adjacent select-gate electrodes 102 is masked with a photoresist film 115 by photolithography to be parallel to the select-gate electrodes 102, and phosphorus (P) is ion-implanted at a dose of $5 \times 10^{15}$ cm$^{-2}$.

As shown in FIG. 4B, the photoresist films 115 are removed, and third gate insulating films 104 each made of a 50-nm silicon oxide film are formed on the side walls of the select-gate electrode 102 by thermal oxidation. Subsequently, a silicon nitride film 113 and silicon nitride side walls 114 are removed with phosphoric acid by etching.

As shown in FIG. 4C, fourth gate insulating films 105 each made of a silicon oxide film or silicon nitride and oxide films having a thickness of about 10 nm are formed on the surface of a silicon substrate 100 on the two sides of the select-gate electrode 102. A 100-nm thick phosphorus-doped polysilicon film is formed on the resultant structure by CVD and is etched back by anisotropic dry etching to form polysilicon side walls 116. Thereafter, arsenic is ion-implanted to the silicon substrate 100 at a dose of $5 \times 10^{15}$ cm$^{-2}$.

As shown in FIG. 4D, the resultant structure is annealed at 850° C. in a nitrogen atmosphere to activate phosphorus and arsenic that are ion-implanted, thereby forming the buried diffusion layers 107a and 107b. Since phosphorus is ion-implanted to be asymmetric with respect to the select-gate electrode 102, the buried diffusion layer 107a does not overlap the select-gate electrode 102. In contrast to this, the buried diffusion layer 107b is formed such that its end portion overlaps that of the select-gate electrode 102.

As shown in FIG. 4E, a fifth gate insulating film 108 made of a silicon oxide film or ONO having a thickness of about 20 nm, when converted into the thickness of a silicon oxide film, is formed on the surfaces of a second polysilicon film 112 and the polysilicon side walls 116. In formation of the fifth gate insulating film 108, comparatively thick silicon oxide films 109 are formed on the buried diffusion layers 107a and 107b by high-rate oxidation.

As shown in FIG. 4F, a 300-nm thick phosphorus-doped polysilicon film is formed on the resultant structure and is patterned by photolithography and anisotropic dry etching to form a control-gate electrode 110 serving as the word line. Subsequently, the fifth gate insulating film 108 is selectively removed, and the second polysilicon film 112 and polysilicon side walls 116 are patterned to be self-aligned with the control-gate electrode 110, thereby forming the floating-gate electrode 106.

Finally, an insulating interlayer film is formed in accordance with a normal semiconductor integrated circuit forming method. Contact holes are formed and are filled with a conductive material. Thereafter, metal interconnections and electrodes are formed, thereby completing the manufacturing steps of the nonvolatile semiconductor memory device of this embodiment basically.

Subsequently, a BPSG film may be formed and annealing may be performed to form an insulating interlayer film. Contact holes may be formed in units of several- to several 10-bit memory cells constituted by the buried diffusion layers, and may be filled with a conductive material. Metal interconnections may be formed parallel to the bit lines made of the buried diffusion layers. Then, the resistance of the bit lines can be decreased.

As has been described above, in the nonvolatile semiconductor memory device according to the present invention, the floating-gate electrode is formed to surround the select-gate electrode from three sides, and the control-gate electrode is formed to surround the floating-gate electrode from three sides. The area through which the floating-gate electrode and control-gate electrode oppose each other increases, and a large coupling capacitance can be ensured between these electrodes. As a result, a write and erase can be performed efficiently, thereby improving the operation reliability of the semiconductor memory device.

The floating-gate electrode is formed to cover both the drain- and source-side side walls of the control-gate electrode. Therefore, after the polysilicon film is etched back by anisotropic dry etching to form the polysilicon side walls on the two side surfaces of the select-gate electrode, a step of removing the side wall on one side becomes unnecessary. The photolithography steps can be decreased, thereby decreasing the number of manufacturing steps.

What is claimed is:

1. A nonvolatile semiconductor memory device comprising:
   source and drain regions of a second conductivity type stripped parallel to each other in a surface region of a semiconductor substrate of a first conductivity type constituting bit lines;

a select-gate electrode formed on said semiconductor substrate, between said source and drain regions, on a first gate insulating film, parallel to said source and drain regions, in which one side of said select-gate electrode is offset from said source and drain regions;

a floating-gate electrode which is in contact with upper and side surfaces of said select-gate electrode through second and third gate insulating films, respectively, and with said semiconductor substrate through a fourth gate insulating film, two sides of said floating-gate electrode at least partly overlapping said source and drain regions, and a control-gate electrode formed on said floating-gate electrode to surround said floating-gate electrode through a fifth gate insulating film, said control-gate electrode perpendicularly intersecting said source and drain regions to constitute a word line.

2. A device according to claim 1, wherein said second gate insulating film has a thickness not less than twice that of said first gate insulating film.

3. A device according to claim 1, wherein two sides of said select-gate electrode are offset from source- and drain-side portions of said source and drain regions.

4. A device according to claim 1, wherein one side of said select-gate electrode partly overlaps a source-side portion of said source and drain regions and the other side of said select-gate electrode is offset from a drain-side portion of said source and drain regions, and one side of said floating-gate electrode completely overlaps said source-side portion of said source and drain regions, and the other side of said floating-gate electrode partly overlaps said drain-side portion of said source and drain regions.

5. A device according to claim 1, wherein said bit lines and said word line that intersect each other, said select-gate electrode, and said floating-gate electrode constitute a plurality of memory cells, and all pieces of information stored in said memory cells are erased at the same time.

6. A device according to claim 1, wherein said bit lines and said word line that intersect each other, said select-gate electrode, and said floating-gate electrode constitute a plurality of memory cells, and information stored in said memory cells can be erased either in units of word lines or in units of bit lines.

7. A device according to claim 1, wherein said bit lines and said word line that intersect each other, said select-gate electrode, and said floating-gate electrode constitute a plurality of memory cells, and information is erased from and written in said memory cells by a Fowler-Nordheim tunnel current.

* * * * *